(12) United States Patent
Gurumurthy et al.

(10) Patent No.: US 7,998,857 B2
(45) Date of Patent: Aug. 16, 2011

(54) INTEGRATED CIRCUIT AND PROCESS FOR FABRICATING THEREOF

(75) Inventors: Charan Gurumurthy, Higley, AZ (US);
Islam Salama, Chandler, AZ (US);
Houssam Jomaa, Phoenix, AZ (US);
Ravi Tanikella, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 11/923,194

(22) Filed: Oct. 24, 2007

(65) Prior Publication Data

US 2009/0108455 A1   Apr. 30, 2009

(51) Int. Cl.
*H01L 23/58* (2006.01)
(52) U.S. Cl. ......................................... 438/629; 438/637
(58) Field of Classification Search .................. 257/773, 257/774; 438/629, 637–640
See application file for complete search history.

(56) References Cited

U.S. PATENT DOCUMENTS

| | | | | |
|---|---|---|---|---|
| 2003/0226854 A1* | 12/2003 | Lee | ................................. | 222/72 |
| 2004/0248403 A1* | 12/2004 | Dubin et al. | .................. | 438/637 |
| 2005/0064702 A1* | 3/2005 | Wang et al. | .................... | 438/633 |
| 2006/0022304 A1* | 2/2006 | Rzeznik | ........................ | 257/532 |
| 2006/0068600 A1* | 3/2006 | Toyoda et al. | ................ | 438/761 |
| 2006/0166448 A1* | 7/2006 | Cohen | .......................... | 438/296 |

* cited by examiner

*Primary Examiner* — Leonardo Andújar
(74) *Attorney, Agent, or Firm* — Grossman, Tucker, Perreault & Pfleger, PLLC

(57) ABSTRACT

A process for fabricating an Integrated Circuit (IC) and the IC formed thereby is disclosed. The process comprises providing a substrate. The process further comprises forming a plurality of longitudinal trenches in the substrate and depositing a layer of a first conductive material on at least one longitudinal trench of the plurality of longitudinal trenches. A first layer of a second conductive material is deposited on the layer of the first conductive material. Thereafter, the process includes depositing a second layer of the second conductive material on the first layer of the second conductive material. The second layer of the second conductive material at least partially fills the at least one longitudinal trench. The first conductive material is selected such that a reduction potential of the first conductive material is less than a reduction potential of the second conductive material.

10 Claims, 5 Drawing Sheets

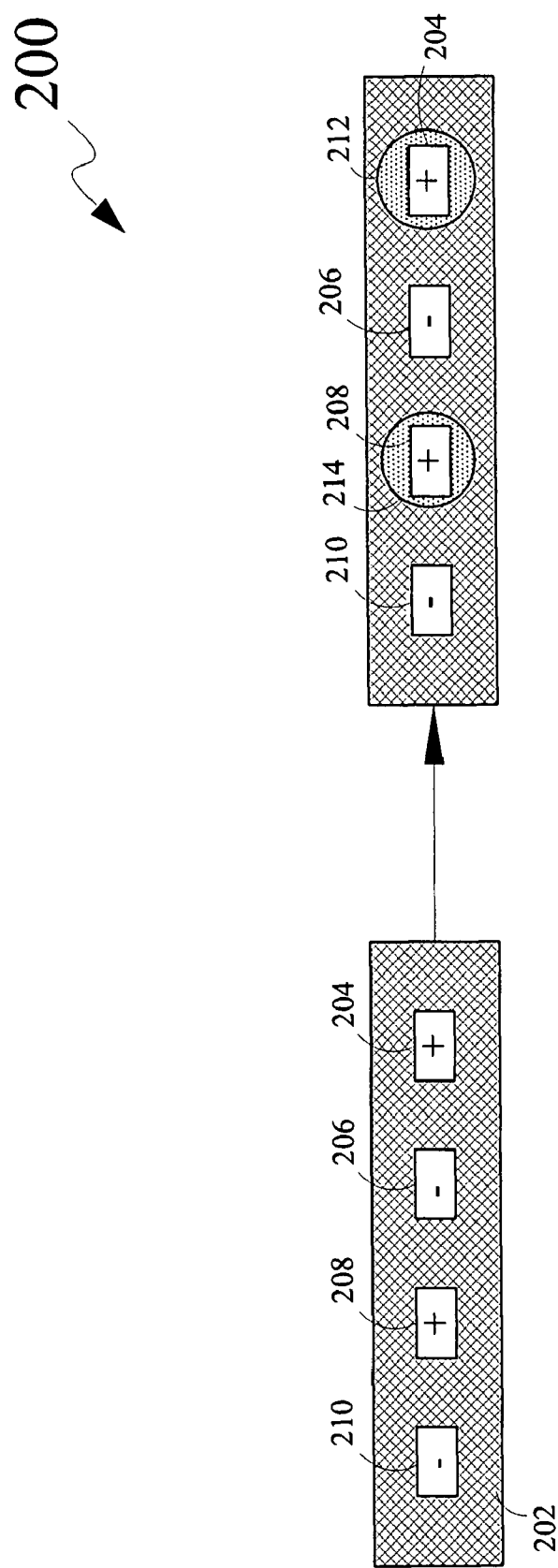

INTEGRATED CIRCUIT AND PROCESS FOR FABRICATING THEREOF

FIELD

The present disclosure generally relates to integrated circuits, and, more particularly, to a process for fabricating an integrated circuit having improved reliability against electrochemical migration or metal migration under a biased voltage.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

FIGS. 2A and 2B illustrate effects of electrochemical migration in a prior art IC.

Like reference numerals refer to like parts throughout the description of several views of the drawings.

DETAILED DESCRIPTION OF THE DISCLOSURE

For a thorough understanding of the present disclosure, reference has to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Figure 1:
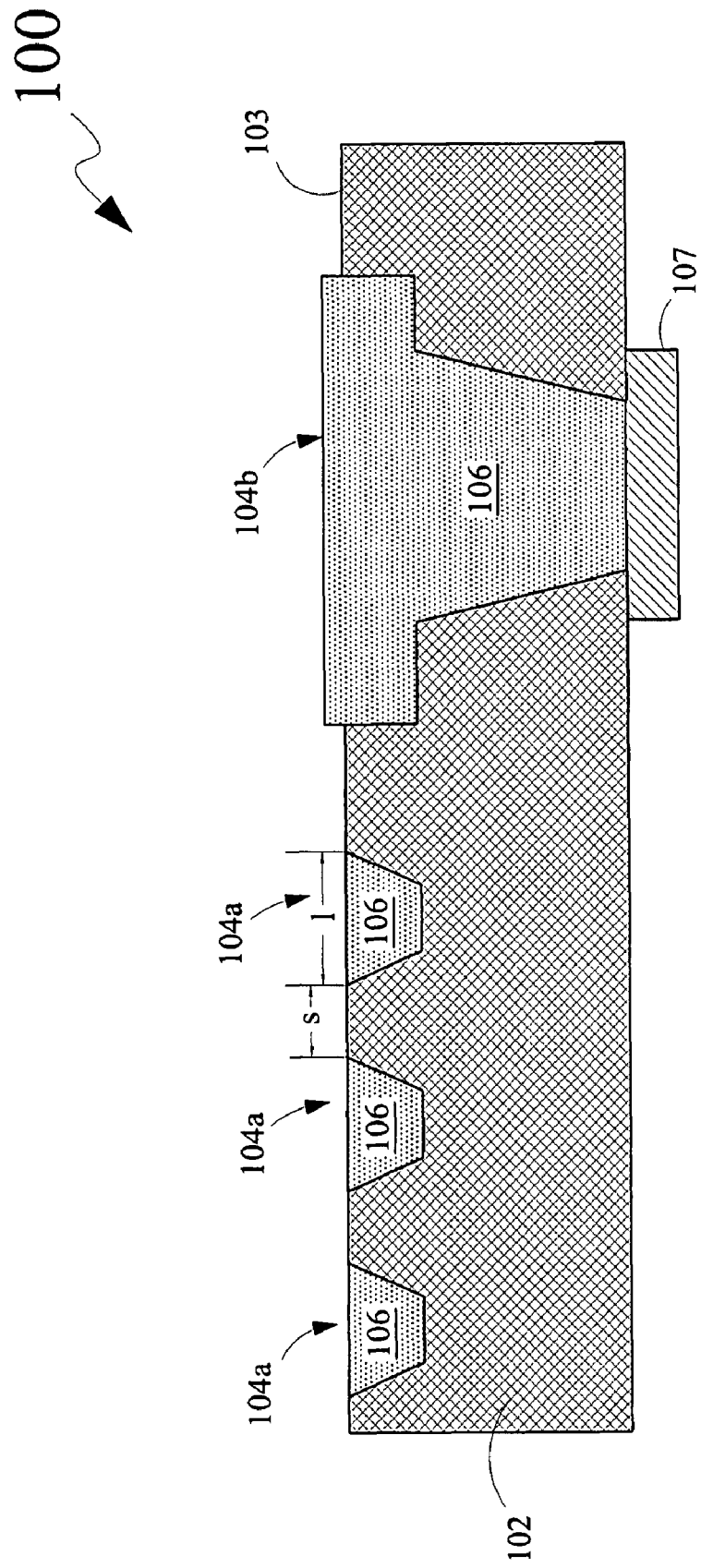
FIG. 1 is a sectional view of an exemplary Integrated Circuit (IC)

FIG. 1 is a sectional view of an exemplary Integrated Circuit (IC) 100, hereinafter referred to as 'IC 100'. The IC 100 comprises a substrate 102 having a surface 103. In FIG. 1, the substrate 102 is shown having a single dielectric layer, however the substrate 102 may include a plurality of dielectric layers. A metal layer may be deposited on the dielectric layer as follows: trenches may be embedded into the dielectric layer by laser ablation of the dielectric layer, followed by electroless copper plating and electrolytic copper plating (to fill the trenches), followed by planarization (by CMP or some other means) to isolate the trenches. Any other patterning technique may be used such as imprinting with an imprint tool into the dielectric material (instead of laser) A conductive plane 107 may be disposed between two adjacent dielectric layers of the substrate 102. Further, the substrate 102 comprises a pattern of a plurality of longitudinal trenches 104a and 104b. The longitudinal trenches 104a and 104b may be formed in the substrate 102 by applying any conventional laser or imprinting process such that each of the longitudinal trenches 104a has a lesser depth than the longitudinal trench 104b. Further, the longitudinal trench 104b extends along the entire thickness of a dielectric layer of the substrate 102.

The longitudinal trenches 104a and 104b are filled with a conductive material 106 such as Copper (Cu). The longitudinal trench 104a, which is filled with the conductive material 106, may form a conductive trace. Hence the longitudinal trench 104a may be hereinafter interchangeably referred to as a 'conductive trace 104a'. The conductive traces 104a may be of different polarities. Further, the longitudinal trench 104b, which is also filled with the conductive material 106, may form a via in the substrate 102. Each via may form a connection between two (or more) adjacent layers, and each trench may be disposed in a single layer. Hence, the longitudinal trench 104a may be hereinafter interchangeably referred to as a 'via 104b'.

As shown in FIG. 1, the structure of the conductive trace 104a is in the form of a cavity. The conductive material 106 is filled in the conductive trace 104a so as to completely fill the cavity of the longitudinal trench 104a. The via 104b may have a structure similar to the longitudinal trench 104a. The via 104b provides connectivity to the conductive plane 107 disposed between two dielectric layers of the substrate 102 through the conductive material 106 filled in the via 104b.

Further, the conductive trace 104a has a width associated with it, shown as 'l' in the FIG. 1 and may be hereinafter referred to as line-width 'l'. Furthermore, two conductive traces 104a are separated from each other by a distance, which is shown as 's' in FIG. 1 and may be hereinafter referred to as space-width 's'.

Therefore, in the substrate 102, which has the conductive traces 104a and the via 104b, the line-width 'l' denotes a width of the conductive trace 104a and a space-width s denotes a separation width between two adjacent conductive traces 104a. The fabrication technology today is advancing towards a finer line-width 'l' and space-width 's'. Accordingly, a larger number of components may be integrated in an electronic circuit (not shown) on the substrate 102, which increases the performance of the electronic circuit. However, fabricating integrated circuits with finer line-width 'l' and space-width 's' increases the risk of formation of short-circuits between oppositely polarized conductive traces 104a of the substrate 102 due to metal electrochemical migration under the application of a specified voltage and under conditions of moisture and ionic contamination that may favor electrochemical migration.

The short-circuit between the oppositely polarized conductive traces of the conductive traces 104a may occur due to electrochemical migration therebetween. Electrochemical migration is an occurrence of a conductive metal bridge forming between adjacent conductive traces, such as between the conductive traces 104a of the IC 100, when they are subjected to a DC voltage bias (or AC). The formation of the conductive (and other unintended ionic contaminants from the fabrication process) metal bridges is facilitated by a presence of water or moisture in the substrate 102. Therefore, considering that Cu is used as a metal for forming conductive traces on a substrate, one configuration of a cell reaction that allows migration of metal ions between conductive traces under the application of a is represented as equation (1) below:

$$Cu^{2+} + 2OH^- \rightarrow H_2 + \tfrac{1}{2}O_2 + Cu \qquad (1)$$

Several other reactions may occur depending on the applied voltage, the moisture content, the pH of the dieleric medium and whether there are any other contaminants the above equation serves only to illustrate a potential pathway for electrochemical migration.

In equation (1), $Cu^{2+}$ represents copper ion, $OH^-$ represents hydroxyl ions, $H_2$ represents Hydrogen and $O_2$ represents Oxygen.

When an electrical bias is applied to the conductive trace 104a, metal ions, such as Cu ions, of the conductive material 106 of the conductive trace 104a react with the water or the moisture that may be present in the substrate 102. Further, the metal ions may diffuse into the dielectric layer 102. As a result of the diffusion process, a conductive bridge of the Cu is formed between the two adjacent conductive traces (or dendrite growth) 104a, which in turn may short the two adjacent conductive traces 104a. If the two adjacent conductive traces 104a have biases of opposite polarities, creation of such short-circuits between the two adjacent conductive traces 104a may be disastrous for an electronic circuit of the substrate 102. The electrochemical migration between oppositely polarized conductive traces 104a of the substrate 102 is explained further in conjunction with FIGS. 2A and 2B.

FIGS. 2A and 2B illustrate the effect of electrochemical migration in a prior art IC 200 (hereinafter referred to as 'IC 200'). FIG. 2A illustrates the IC 200, which comprises a substrate 202, similar to substrate 102 of IC 100. The substrate 202 comprises conductive traces 204, 206, 208 and 210 formed therein. The conductive traces 204 and 208 are provided a positive bias, and the conductive traces 206 and 210 are provided a negative bias. Therefore, the conductive traces 204 and 208, and the conductive traces 206 and 210 are oppositely polarized conductive traces. The IC 200 is subjected to a Highly Accelerated Stress Test (HAST), which simulates normal operation conditions in a much shorter period of time. The IC 200 is provided a voltage bias of 3.5V in a controlled environment where the temperature is maintained at 130° C. and humidity is at 85%.

FIG. 2B illustrates formation of conductive bridges 212 and 214 between oppositely polarized conductive traces as a result of electrochemical migration. The conductive bridge 212 may form a short-circuit between the conductive trace 204, which has the positive bias, and the conductive trace 206, which has the negative bias. Further, the conductive bridge 214 may form a short-circuit between the conductive trace 208, which has positive bias, and the conductive trace 210, which has the negative bias. As explained earlier, the conductive bridges 212 and 214 are formed as a result of electrochemical migration of metal ions of the conductive traces 204 and 208 respectively into the substrate 202.

The effects of electrochemical migration are more pronounced in an IC, similar to the IC 100 or the IC 200, as the line-width 'l' and the space-width 's' become smaller. It is observed that such an IC has higher possibility of forming a short-circuit between the oppositely polarized conductive traces of the IC due to a closer placement of conductive traces (for example, between the conductive traces 204 and 206 of the IC 200). Experiments show that with the dielectric material currently used in fabrication processes worldwide, a reliable IC, similar to the IC 100, may be fabricated with a limitation of the minimum line-width 'l' and a minimum space-width 's' beyond which the reliability of the formed circuit is in question. The effect of the electrochemical migration is more likely to occur in case of the line-width 'l' being less than 10 μm and space-width 's' being less than 10 μm. Based on the foregoing discussions, there arises a need for a reliable IC with reduced electrochemical migration even in the case when the conductive traces have a finer line-width 'l' and a space-width 's', such as less than 10 μm.

The present disclosure addresses the issue of fabricating a reliable IC with finer line-width 'l' and space-width 's' in which the effects of electrochemical migration are reduced considerably. The present disclosure proposes an IC in which electrochemical migration may be prevented by adding a 'barrier metal layer' on a surface of the conductive traces of the IC by simple electroless metal plating. The barrier metal layer comprises a metal having a lesser reduction potential than the conductive material, such as the conductive material 106, of the conductive trace of the IC. Referring back to equation (1), a metal such as Nickel (Ni) or Tin (Sn), which has a lesser reduction potential than that of Cu, may be utilized for the cell reaction, as the standard potential for the cell reaction is negative. Due to the negative standard potential of the barrier metal, the cell reaction of the barrier metal with water is less favorable than when Copper alone is utilized. Thus, if the surface of the conductive traces of the IC is covered by the barrier metal, such as Ni or Sn, the diffusion of the conductive material 106 of the conductive traces into the substrate of the IC may be slowed, thereby reducing the electrochemical migration, which improves the reliability of the IC.

Figure 3A:
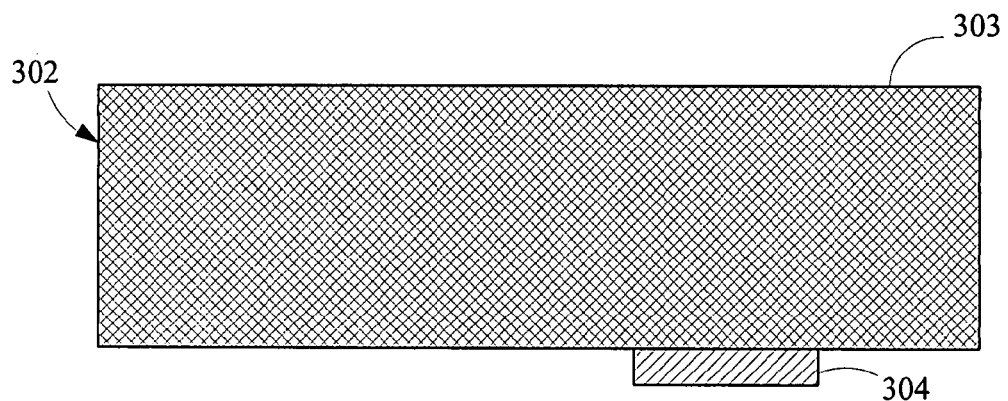
FIGS. 3A through 3E illustrate various stages in fabrication of an IC, according to an exemplary embodiment of the present disclosure.

FIGS. 3A through 3E illustrate various stages in fabrication of an IC 300 (See FIG. 3E), according to an embodiment of the present disclosure. In a first stage, a substrate 302 is provided, as illustrated in FIG. 3A. The substrate 302 comprises a conductive plane 304 lying below the substrate 302. It will be obvious to a person skilled in the art that the substrate 302 may comprise multiple dielectric layers. However, for sake of simplicity, the substrate 302 is in the form of a single dielectric layer, as shown in FIGS. 3A through 3E. In case of the multiple dielectric layers, the conductive plane 304 may lie between two adjacent layers of the substrates 302. The substrate 302 is capable of allowing patterns on a surface 303 of the substrate 302. The patterns formed in the substrates 302 may be utilized for forming components including, but not limited to, conductive traces and vias.

Figure 3B:
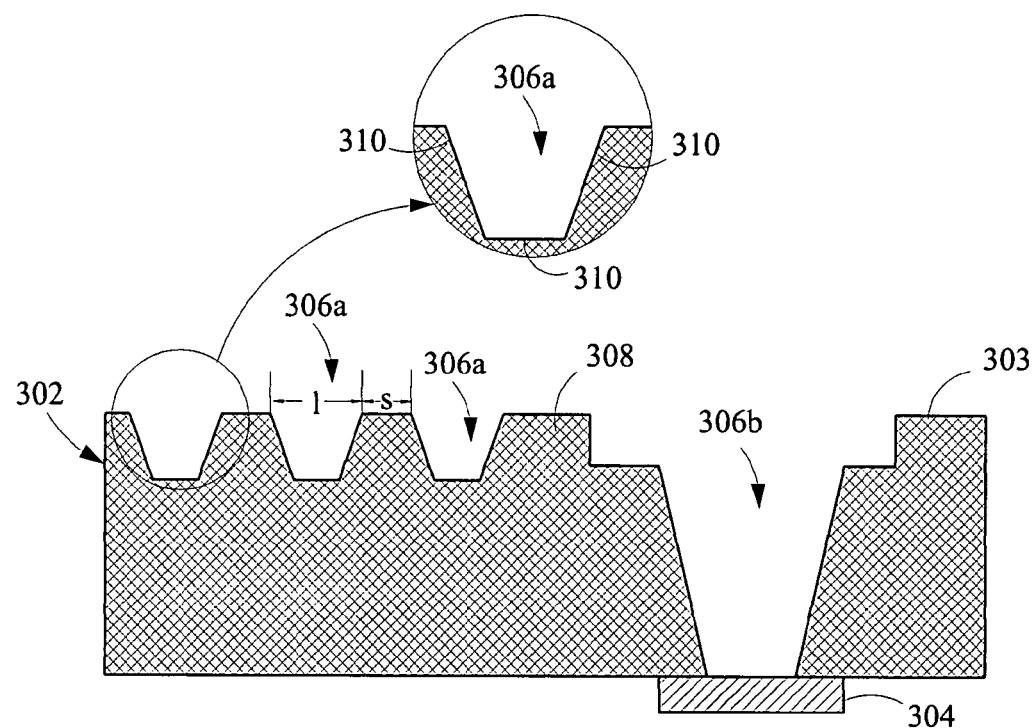

In a second stage in the fabrication of the IC 300, patterns are formed in the substrate 302, as illustrated in FIG. 3B. Preferably, a Laser Projection Patterning (LPP) may be used to obtain substrates with finer line-width 'l' and space-width 's'. However, it will be obvious to a person skilled in the art that the present disclosure is not limited to the use of LPP only and any other conventional lithographic processes may also be utilized on the surface 303 to create patterns in the substrate 302. For example, semi-additive plating (SAP) process may be used with photolithography, which may include forming the pattern on top of electroless copper, then electrolytic plating with copper, followed by dry film resist removal and quick etching to remove the seed layer (and after which an immersion reaction with tin may be used). The patterns formed on the substrate 302 comprise a plurality of longitudinal trenches 306a and 306b.

The longitudinal trenches 306a and 306b may be similar in configuration to the longitudinal trenches 104a and 104b, as described in conjunction with FIG. 1. Each of the longitudinal trenches 306a and 306b comprises a peripheral surface 310, which provides a structure of a cavity to the each of the longitudinal trenches 306a and 306b. The peripheral surface 310 of the longitudinal trenches 306a and 306b is shown to have inclined walls. However, it will be obvious to a person skilled in the art that the longitudinal trenches 306a and 306b may be of other shapes. It will be apparent from FIG. 3B that the cavities formed in the longitudinal trenches 306a has a depth less than that of the cavity formed in the longitudinal trench 306b. Further, the longitudinal trench 306b extends along the entire thickness of a dielectric layer of the substrate 302 to connect to the conductive plane 304 lying below the dielectric layer of the substrate 302. Accordingly, the longitudinal trenches 306a may form conductive traces and the longitudinal trace 306b may form a via. Hereinafter, the longitudinal trenches 306a may be interchangeably termed as 'conductive traces 306a' and the longitudinal trace 306b may be interchangeably termed as 'via 306b'.

The longitudinal trenches 306a are spaced apart from each other by a distance which is the space-width 's' (shown in FIG. 3B). Further, the width of the longitudinal traces 306a is shown as line-width 'l' in FIG. 3B. Further, an intermediate substrate material 308 lies between two adjacent longitudinal trenches 306a and between the longitudinal trench 306a and the longitudinal trench 306b.

Figure 3C:
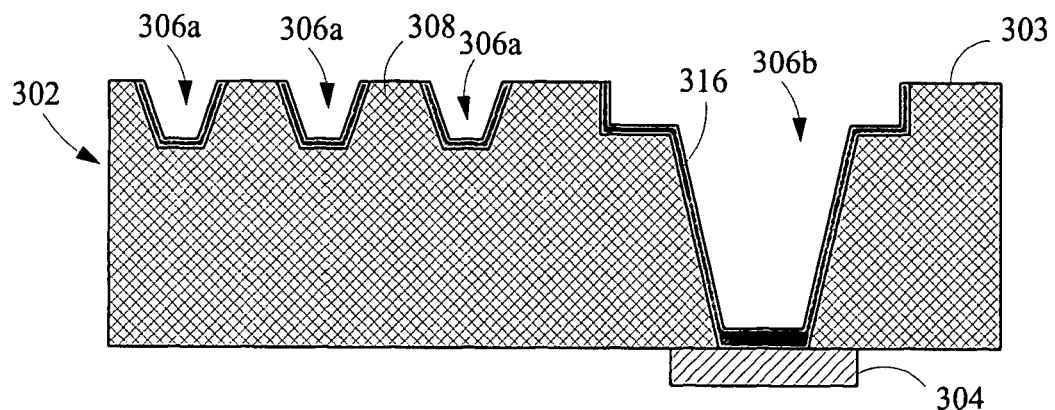

In a third stage, a layer 316 of a first conductive material (hereinafter referred to as 'layer 316'), is deposited on the peripheral surface 310 of the longitudinal trenches 306a and 306b, as illustrated in FIG. 3C. Suitable first conductive materials include, but are not limited to, Ni, Sn, Electroless Nickel Immersion Gold (ENIG) and Nickel-Palladium-Gold Alloy (NiPdAu) or any other metal with a higher electrochemical reduction potential (i.e. is more favorably reduced than copper) In one embodiment of the present disclosure, the first conductive material comprises Ni. The layer 316 forms a 'barrier metal layer', which slows down the migration of conductive material from the conductive traces 306a and the via 306b. Further, the layer 316 is deposited on the peripheral surface 310 of the longitudinal trenches 306a and 306b by applying an electroless plating process. It should be noted that the electroless plating for Ni, followed by electroless Cu plating will occur over most of the surface, not just the trenches. This is then followed by overall plating for the surface with electrolytic plating, and followed by any combination of (not limited to) CMP, chemical etching, flash etching, mechanical planarization and the link to isolate the trenches. Any combination of electroplating chemistry, current profile, DC vs. Periodic reverse pulse plating, and/or agitation may be used for proper trench filling at minimum surface plating.

Optionally, prior to depositing the layer 316 of the first conductive material, the peripheral surface 310 may be treated with a catalyst to aid plating reactions involved in the electroless plating. More specifically, the peripheral surfaces 310 of the longitudinal trenches 306a and 306b may be deposited with a layer of a catalytic material. The catalytic material may be composed of substances including, but not limited to, Palladium (Pd) compounds.

Figure 3D:
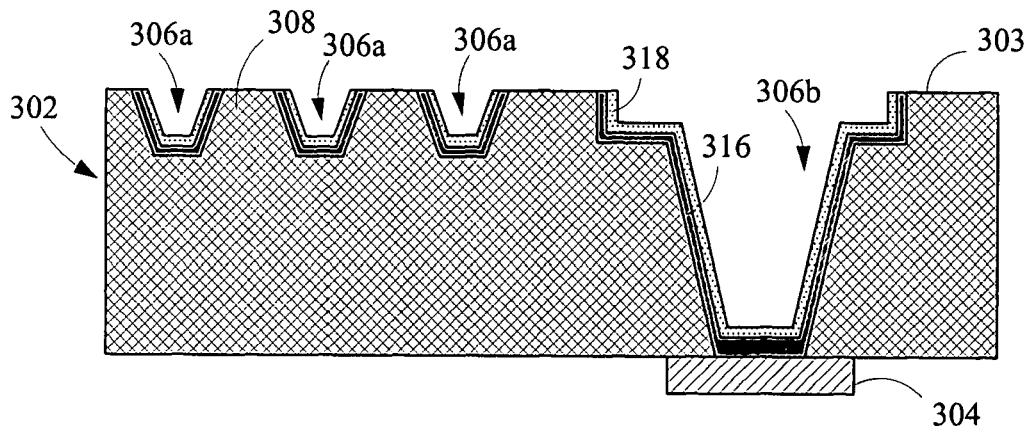

In a fourth stage, a first layer 318 of a second conductive material (hereinafter referred to as 'first layer 318') is deposited on the layer 316, as illustrated in FIG. 3D. The first layer 318 extends over the entire length of the layer 316, which is deposited over the peripheral surface 310 of the longitudinal trenches 306a and 306b. In one embodiment of the present disclosure, the second conductive material comprises Cu. However, it will be obvious to a person skilled in the art that other conductive materials having good conducting properties may also be used as the second conductive material. Further, the first layer 318 is deposited on the layer 316 by a first plating process. In one embodiment of the present disclosure, the first plating process comprises electroless plating. In the electroless plating process, the second conductive material displaces the first conductive material of the layer 316 to form the first layer 318. For example, in the said embodiment, the Cu displaces the Ni of the layer 316 to form the first layer 318. As a result of the displacement reaction, the thickness of layer 316 reduces. To counteract the reduction in the thickness of the layer 316, the initial thickness of the layer 316 may be kept greater than a desired final thickness of the layer 316. In alternative embodiments, electroless methodology may be used for depositing.

In a final stage, a second layer 320 of the second conductive material (hereinafter referred to as 'second layer 320') is deposited on the first layer 318 to form the IC 300. The second layer 320 is deposited on the first layer 318 such that the second conductive material of the second layer 320 at least partially fills the cavities of the longitudinal trenches 306a and 306b. The second layer 320 is deposited on the first layer 318 using a second plating process. In one embodiment of the present disclosure, the second plating process is an electrolytic process. However, it will be obvious to a person skilled in the art that any other plating process may also be used to deposit the second layer 320 on the first layer 318. Thereafter, the longitudinal trenches 306a, filled with the second conductive material of the second layer 320, form conductive traces 306a of the IC 300. Furthermore, the longitudinal trench 306b, filled with the second conductive material of the second layer 320, forms the via 306b of the IC 300.

Figure 3E:
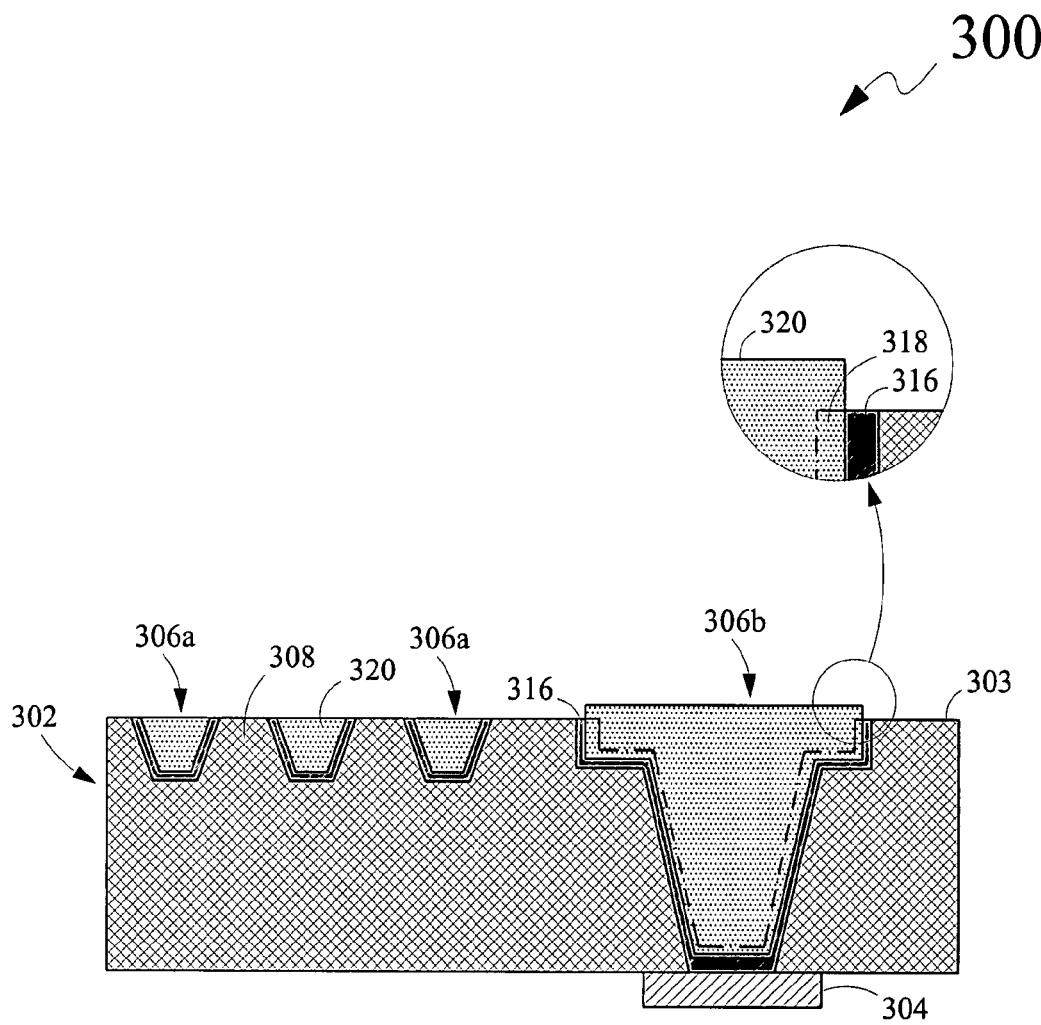

The present disclosure provides the IC 300, which is formed through the various stages, as described in conjunction with FIGS. 3A through 3E. As shown in FIG. 3E, the IC 300 comprises the substrate 302. The substrate 302 comprises a plurality of longitudinal trenches such as the longitudinal trenches 306a and the longitudinal trench 306b. Further, the substrate 302 comprises a layer of a first conductive material, such as layer 316, disposed on the peripheral surface 310 of the longitudinal trenches 306a and 306b. Suitable first conductive materials include, but are not limited to, Ni, Sn, ENIG and NiPdAu. The layer 316 of the first conductive material may be deposited by using electroless plating process. Further a first layer of a second conductive material, such as the first layer 318, is deposited on the layer 316. In one embodiment of the present disclosure, the second conductive material comprises Cu. The first layer 318 may be deposited using an electroless plating process. Furthermore, a second layer of the second conductive material, such as the second layer 320, is deposited on the first layer 318. The second layer 320 may at least partially fill the cavity of the each longitudinal trench of the plurality of longitudinal trenches 306a and 306b. The second layer 320 may be deposited using an electrolytic plating process.

Further, in an embodiment of the present disclosure, the IC 300 may be applied with a Chemical-Mechanical Planarization (CMP) to remove any excess amount of the second conductive material that might be deposited on the surface 303 of the substrate 302. The CMP is essential to electrically isolate the conductive traces 306a and the vias 306b from each other by removing the excess second conductive material lying in between two adjacent conductive traces 306a or lying between the conductive traces 306a and the vias 306b. In another embodiment of the present disclosure, 'polymer stamping' may be used after the deposition of the first layer 318 of the second conductive material. Polymer stamps, such as polydimethylsiloxane stamps, may be used to prevent unwanted deposition of Cu on the surface 303 of the substrate 302 and restrict the deposition of Cu on the conductive trace 306a and on the via 306b only.

While the present disclosure describe the use of Ni as a first conductive material, it will be obvious to a person skilled in the art that any other material, which has reduction potential less than that of Cu, may also be used effectively to produce the same effect as described in the present disclosure. In an embodiment of the present disclosure, Sn, which behaves similar to Ni according to the electrochemical series, may be used as the first conductive material. In another embodiment of the present disclosure, metal combinations, such as Electroless Nickel Immersion Gold (ENIG) or Nickel-Palladium-Gold Alloy (NiPdAu) may also be used as the first conductive material to prevent diffusion of Cu into the substrate 302 by forming a barrier metal layer.

Various embodiments of the present disclosure offer following advantages. The use of a barrier metal layer comprising the layer 316 slows down the diffusion of Cu of the conductive traces 306a and the via 306b into the substrate 302. A slower diffusion rate prevents the formation of conductive bridges between conductive traces and vias of opposite polarities, thereby preventing short-circuit. Accordingly, the IC 300, as described in the present disclosure is more reliable and long lasting than the prior art IC 100.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A process for fabricating an integrated circuit, the process comprising:
   providing a substrate;
   forming a plurality of longitudinal trenches in the substrate;
   depositing a layer of a first conductive material on a peripheral surface of at least one longitudinal trench of the plurality of longitudinal trenches, wherein the first conductive material comprises tin (Sn);
   depositing a first layer of a second conductive material on the layer of the first conductive material by using a first plating process; and
   forming at least one conductive path by depositing a second layer of the second conductive material on the first layer of the second conductive material using a second plating process;
   wherein an initial thickness of the first layer prior to forming the at least one conductive path is greater than a final thickness of the first layer after forming the at least one conductive path;
   wherein the second layer of the second conductive material at least partially fills the at least one longitudinal trench of the plurality of longitudinal trenches; and
   wherein a reduction potential of the first conductive material is less than a reduction potential of the second conductive material.

2. The process of claim 1 further comprising depositing a layer of a catalytic material on the peripheral surface of the at least one longitudinal trench of the plurality of longitudinal trenches prior to depositing the layer of the first conductive material.

3. The process of claim 2, wherein the catalytic material comprises Palladium (Pd) compounds.

4. The process of claim 1, further comprising applying Chemical Mechanical Planerization (CMP) at the at least one conductive path.

5. The process of claim 1, wherein forming the plurality of longitudinal trenches in the substrate comprises applying a photo-resist mask layer over the substrate and exposing the photo-resist mask layer to a light source.

6. The process of claim 5, wherein the light source comprises a LASER source.

7. The process of claim 1, wherein the layer of first conductive material is deposited by an electro-less plating process.

8. The process of claim 1, wherein the second conductive material comprises Copper (Cu).

9. The process of claim 1, wherein the first plating process comprises an electro-less plating process.

10. The process of claim 1, wherein the second plating process comprises electrolytic plating process.

* * * * *